(12) United States Patent
Rexberg et al.

(10) Patent No.: US 7,505,530 B2
(45) Date of Patent: Mar. 17, 2009

(54) PRE-DISTORTION USING A BY-PASS SIGNAL

(75) Inventors: Leonard Rexberg, Hässelby (SE);
Bernt Johansson, Kista (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 815 days.

(21) Appl. No.: 10/480,835

(22) PCT Filed: May 5, 2002

(86) PCT No.: PCT/SE02/01074

§ 371 (c)(1),
(2), (4) Date: Dec. 15, 2003

(87) PCT Pub. No.: WO02/103897

PCT Pub. Date: Dec. 27, 2002

(65) Prior Publication Data

US 2004/0156447 A1    Aug. 12, 2004

(30) Foreign Application Priority Data

Jun. 14, 2001 (SE) .................................. 0102122

(51) Int. Cl.
*H04L 1/02* (2006.01)
(52) U.S. Cl. ...................................... 375/296; 375/297
(58) Field of Classification Search ................ 375/296, 375/297; 330/149–151, 162, 305; 327/317, 327/306, 100; 398/158; 455/114.3, 313, 455/114.2, 127.1
See application file for complete search history.

(56) References Cited

U.S. PATENT DOCUMENTS

| | | | |
|---|---|---|---|
| 5,049,832 A * | 9/1991 | Cavers | 330/149 |
| 5,598,436 A | 1/1997 | Brajal et al. | |
| 6,172,562 B1 | 1/2001 | Cazaux et al. | |
| 6,654,591 B1 * | 11/2003 | Hoffmann | 455/114.1 |
| 6,850,114 B2 * | 2/2005 | Nygren et al. | 330/149 |
| 6,947,711 B1 * | 9/2005 | Leyonhjelm | 455/114.3 |
| 6,973,138 B1 * | 12/2005 | Wright | 375/297 |
| 2001/0052816 A1 * | 12/2001 | Ahn | 330/149 |

FOREIGN PATENT DOCUMENTS

EP    1067676 A1    1/2001

OTHER PUBLICATIONS

Andreani et al., "Chip for wide-band digital pre-distortion RF power amplifier linearization", Electronics Letters vol. 33 No. 11, May 22, 1997, pp. 925-926.

* cited by examiner

*Primary Examiner*—Mohammed H. Ghayour
*Assistant Examiner*—Lawrence B Williams
(74) *Attorney, Agent, or Firm*—Nixon & Vanderhye, P.C.

(57) ABSTRACT

An output signal from an inherently non-linear device is linearized by sampling an original signal with a first sampling rate for a desired signal resolution of an achieved digital original signal message; and re-sampling the original signal at a second sampling rate for creating a digital pre-distortion signal to be added to the achieved digital original signal message. The second sampling rate is greater than the first sampling rate, thereby forming a digital pre-distorted signal to be fed to the inherently non-linear device after digital to analog conversion.

17 Claims, 9 Drawing Sheets

Analog signal

Sampled signal

Requirement: $f_s > 2f_H$

Under-Sampled signal

Sampling rate is too low: $f_s < 2f_H$
D/A conversion is not any longer possible.

Pre-distorted Sampled signal

Overlap regions

Conventional digital Predistortion

By-pass Predistortion

PRE-DISTORTION USING A BY-PASS SIGNAL

This application is the US national phase of international application PCT/SE02/01074, filed in English on 05 May 2002, which designated the US. PCT/SE02/01074 claims priority to SE Application No. 0102122.9 filed 14 Jun. 2001. The entire contents of these applications are incorporated herein by reference.

BACKGROUND

I. Field of the Invention

This invention relates to digital pre-distortion of an inherently non-linear device. Specifically it deals with achieving a broadband digital signal with high resolution as a pre-distorted signal without the need for fast D/A converters using a high number of bits for high resolution.

II. Related Art and Other Considerations

One of the operator's main goals is to be able to offer high capacity to their customers in the network. High capacity in terms of number of channels in a cellular network requires in turn a tightening of the frequency plan. That is, more frequencies must be made available in a given area than before. The base station has to handle more carriers at the same site. Conventional systems like TDMA (DAMPS) and GSM require more channels and upcoming systems like the WCDMA instead requires a continuous wide bandwidth. This in turn calls for ultra linear amplifiers.

Linear amplifiers are used to amplify several carriers at the same time, as opposite to amplifying each carrier separately and then add them up in, for example, a hybrid-combiner. Hybrid-combiners such as 90° branch line couplers have the disadvantage that for each doublet of carriers there is a 3 dB power loss.

A linear power amplifier typically has an efficiency of about 6% but it keeps relatively constant efficiency as more carriers are added. Moreover, only one amplifier has to be used for all carriers. The main problem with power amplifiers is the linearity of the AM-AM characteristics, whereas hybrid combiners do not suffer from this. Most cellular systems require inter-modulation (IM) products to be in the order of 70 dB down from the carrier. Extensive work has been done to linearize power amplifiers of which feed-forward seems to be the most promising method. Inter-modulation products are simply subtracted at the output of the amplifier by comparing input and output signals of the main amplifier. An error-amplifier adjusts the level of the inter-modulation frequency products (output minus input).

Feed-forward can improve linearity to a certain degree but then it becomes very difficult to achieve the last few dB's necessary for full compliance. A way of further linearizing the amplifier is to pre-distort the input signal to the amplifier and compensate for the non-linearity. There are a number of ways as how to accomplish this. One way is to pre-distort within the feed-forward loop of the MCPA itself. Usually this is done in an analog RF fashion. RF pre-distortion (PD) may also be done outside the full MCPA.

Another way is to implement digital pre-distortion. Digital PD may be used whenever there is a digital combined signal at hand. The introduction of so-called software transceivers makes it particularly convenient to extract this signal. On a system-level there would be a digital software transceiver, a broadband digital-to-analog converter (DAC), some RF components and the RF MCPA basically connected to the antenna port. A digital pre-distorter would preferably be placed between the software transceiver and the DAC.

There is a need for pre-distortion as a means for or complementing classical linearization techniques for non-linear devices. Such devices may be single-carrier power amplifiers (SCPA) or for example multi-carrier power amplifiers (MCPA), or even passive devices.

Linearization, as it is usually implemented for broadband applications, is to use feed forward techniques. By using this technique it is possible to subtract unwanted signal components by comparing the signal before and after the non-linear device. Linearization can be accomplished to a certain degree but is normally implemented in analog fashion with its difficulties, which has to be taken care of, essentially at RF frequencies.

Digital pre-distortion, on the other hand, is usually accomplished at base-band or at some intermediate frequency (IF). Essentially the idea is to perform this where the best control of the signal is achieved, and also where the carrier frequency is much lower than at a real operating frequency.

Designers have been working with linearization basically from the point when amplification of electric signals started off. As a description of the State-of-the-art in linearization techniques one way is to implement pre-distortion in an analog fashion at analog RF directly in front of the non-linear device. Alternatively it may be incorporated within the feed-forward loop in the MCPA itself (if that is the non-linear device). Some ideas have been put forward to place the pre-distorter also at digital base-band as indicated in FIG. 7. The digital signal is copied and fed through a digital pre-distorter and then added to the original digital signal again before it is fed to the D/A converter. The correction is made completely to the digital signal.

For instance, in U.S. Pat. No. 5,598,436 is described a digital transmission system with pre-distortion. However, the circuitry uses different quantification levels for the phase and the amplitude, respectively.

Another U.S. Pat. No. 6,172,562 describes a pre-distorter for controlling the phase and amplitude in order to linearize a non-linear device. The document discusses the problem with high bandwidth demands when using high accuracy digital circuits. Separating the phase and amplitude corrections into two parallel branches then solves this problem.

In an article in Electronics Letters Vol. 33 Nov. 11, 1997 titled "Chip for wide-band digital pre-distortion RF power amplifier linearization" a custom chip for digital pre-distortion is disclosed in which the forward path and the adaptation/control path work with different speeds at a standard resolution of 14 bits. It is pointed out that the linearizer has to operate with a sampling frequency typically four to eight times higher than the signal bandwidth.

Thus, the drawback of today's solution is that a fairly large bandwidth has to be associated with the distorted signal. As most non-linear devices can be modeled as a power series (see FIG. 2), it is clear that signal components whose frequencies are linear combinations of the original ones will appear in the output signal. For example, if the main non-linearity is a $x^3$-component, there will occur frequencies that occupy 3 times as large bandwidth as the original signal (FIG. 1 and FIG. 2). And likewise there will occur frequencies from non-linearity that have also an $x^5$-component, which will give rise to actually 5 times as large bandwidth. The same argumentation can be used for further higher components.

As can be concluded from the above discussion, it is necessary to feed a signal into the device which in itself has the same required bandwidth as the distorted signal wanted to be improved. As there practically is a relation existing between the dynamic range (number of bits, or resolution) for a D/A converter and the sampling frequency, it is also clear that achieving a higher bandwidth of the pre-distorted signal also requires better D/A converters. A low resolution D/A converter may operate at a very high sampling rate, but oppositely it is difficult to design a high resolution D/A converter at the same high sampling rate.

Another view to the problem is that aliases (periodic copies) in the spectrum may occur if one is using a too low sampling rate. So, adding a pre-distorted signal to the original one will cause overlapping signal spectrum as indicated in FIG. 6. The original (analog) signal can no longer be uniquely filtered out properly without suffering from aliasing effects. Performing a D/A-conversion means essentially that the original spectrum in FIG. 3 should be possible to filter out in the digital representation as seen in FIG. 4. If the sampling rate from the start is too low in comparison to the signal bandwidth, aliasing effects as shown in FIG. 5 will occur.

BRIEF SUMMARY

Different D/A converters are used for two signals, i.e. for the original digital message signal (A-branch in FIG. 8) and the pre-distorted digital signal part (B-branch in FIG. 8). In other words, the same high resolution and moderate sampling frequency D/A converter is used for the original digital message signal as is used conventionally, but a D/A with lower resolution with higher sampling rate is used for the added pre-distortion signal. The two signals are then combined in their analog domain. Thus, requirements on high sampling rates for both signals at the same time are avoided. Care should of course be taken to ensure that the two added signals have the proper time alignment or phase alignment.

The distorted contribution to the signal only has signal components that are in the order of the distortion level that are to be subtracted. For example, if the distortion in terms of harmonics is 50 dB below the carrier level on the output of the non-linear device, we only have to see what resolution we must have to come down to the level we desire. If the desired level is 80 dB below the carrier level, then it is clear that a dynamic range is needed which is equivalent to (80−50=)30 dB. In terms of number of bits in a D/A converter this equals 30/6=5 bit resolution where 6 dB [20 log(2)] accounts for every additional bit.

SHORT DESCRIPTION OF THE DRAWINGS

The invention, together with further objects and advantages thereof, may best be understood by making reference to the following description taken together with the accompanying drawings, in which:

FIG. 12b shows a corresponding spectrum as 12a but with full resolution of 15 bits are used for both signal parts, illustrating an almost negligible difference compared to FIG. 12a;

DETAILED DESCRIPTION

Below will be discussed a method for achieving a broadband signal with high resolution as a pre-distorted signal without the need for D/A converters that have these properties in the same device. The discussion will utilize spectra for illustrating example embodiments and modes.

Figure 1:
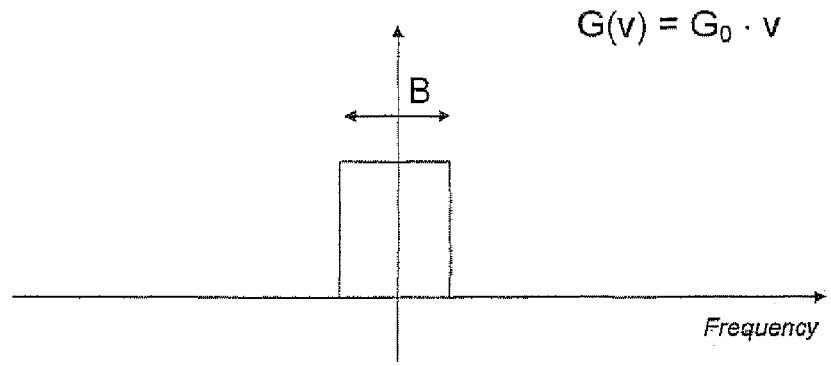
FIG. 1 is an example of input spectrum wherein the bandwidth is B and the amplification is constant, that is $G(v)=G_0 \cdot v$.
Figure 2:
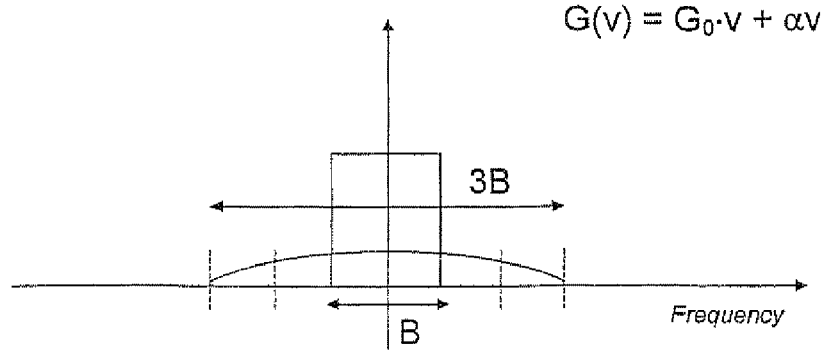
FIG. 2 is an example of an input spectrum together with distorted components as measured at the output of a $3^{rd}$ order non-linearity, whereby the bandwidth of the distortion is 3 times larger than the original input spectrum of the signal.
Figure 3:
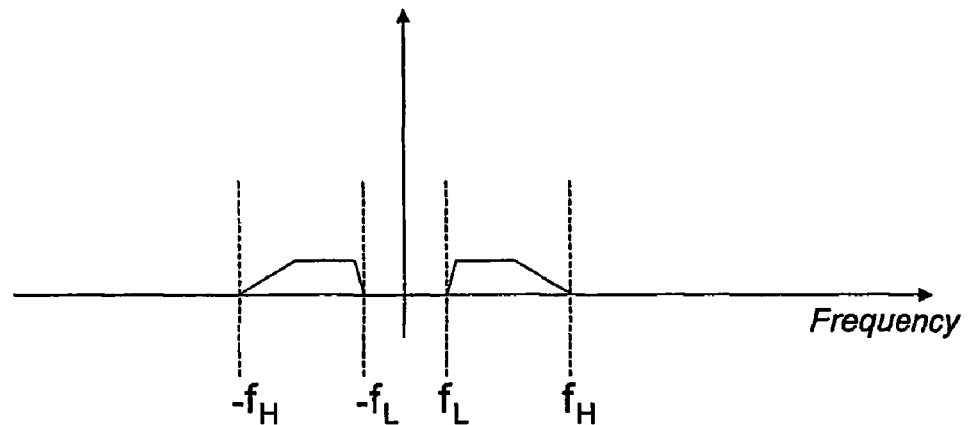
FIG. 3 is an example of an analog input spectrum represented by its negative as well as positive frequency portions, whereby the low and high frequency end points $f_L$ and $f_H$ respectively indicate the bandwidth.
Figure 4:
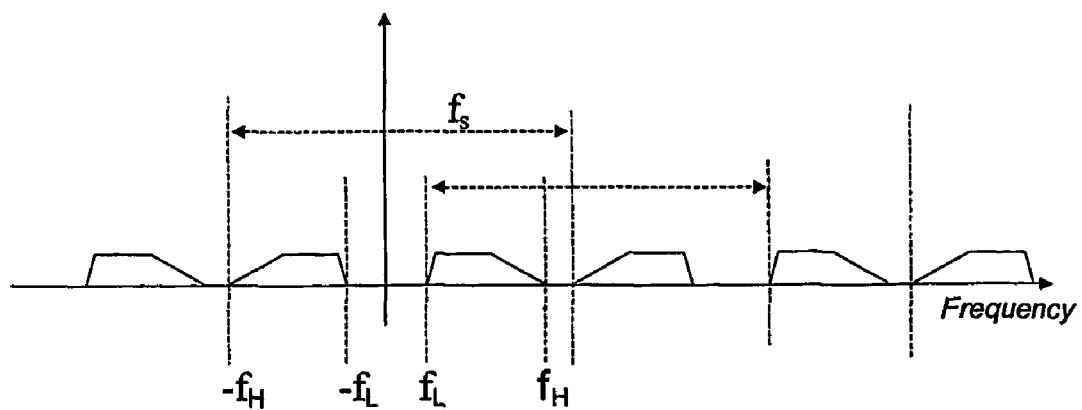
FIG. 4 illustrates the analog signal of FIG. 3 sampled at a sampling rate $f_S$ and the spectrum is repeated periodically with distance $f_S$, whereby the sampling process is repeating both negative and positive frequency parts.
Figure 5:
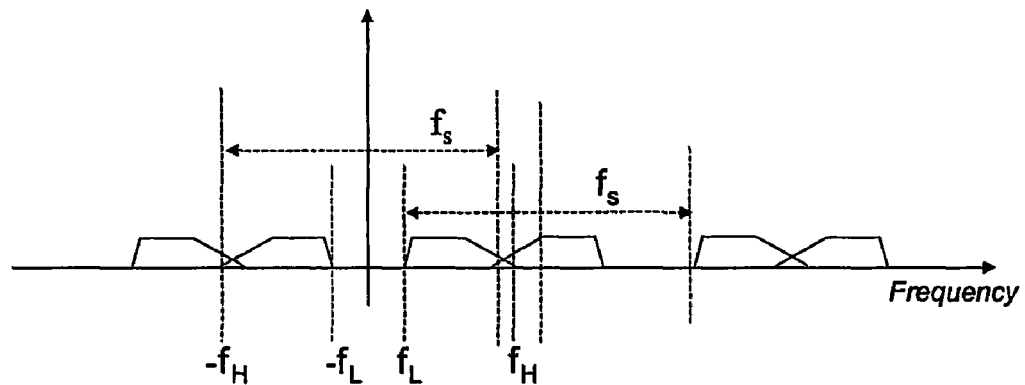
FIG. 5 illustrates sampling of a signal with too low sampling rate, whereby the alias effect will destroy the possibility to reconstruct the original analog signal by filtering.
Figure 6:
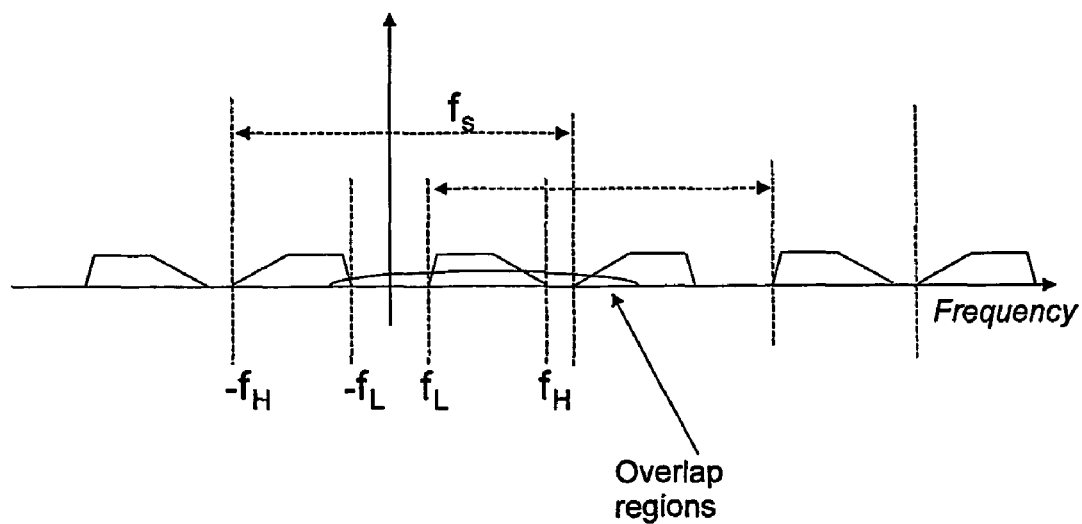
FIG. 6 illustrates that if sampling rate is too low, the needed extra bandwidth for the pre-distorted signal part will overlap other duplicate spectra and it is not possible to recover the 3 times (or more) larger bandwidth signal that is needed for pre-distortion.
Figure 7:
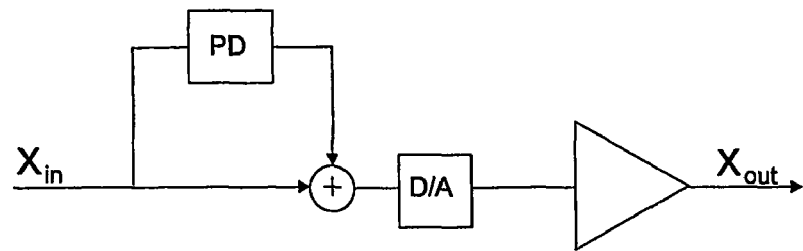
FIG. 7 illustrates conventional digital pre-distortion wherein a portion of the original signal is pre-distorted and again re-inserted into the signal, which is D/A converted before being fed to the non-linear device, the drawback of the solution being the inherent lack of bandwidth of the D/A converter (at the specific sampling rate and dynamic range)
Figure 8:
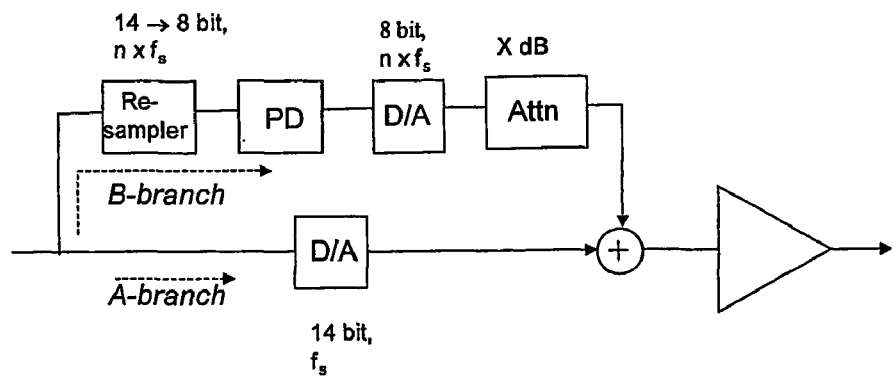
FIG. 8 illustrates an example of pre-distortion by use of the proposed new method of bypassing to a separate D/A converter with a lower resolution, whereby this D/A converter can run at a much higher sampling rate with respect to manufacturing standard of today.

Different D/A converters are used for two signals, i.e. for the original digital message signal (A-branch in FIG. 8) and the pre-distorted digital signal part (B-branch in FIG. 8). In other words, the same high resolution and moderate sampling frequency D/A converter is used for the original digital message signal as is used conventionally, but a D/A with lower resolution with higher sampling rate is used for the added pre-distortion signal. The two signals are then combined in their analog domain. Thus, requirements on high sampling rates for both signals at the same time are avoided. Care should of course be taken to ensure that the two added signals have the proper time alignment or phase alignment.

The distorted contribution to the signal only has signal components that are in the order of the distortion level that are to be subtracted. For example, if the distortion in terms of harmonics is 50 dB below the carrier level on the output of the non-linear device, we only have to see what resolution we must have to comedown to the level we desire. If the desired level is 80 dB below the carrier level, then it is clear that a dynamic range is needed which is equivalent to (80–50=)30 dB. In terms of number of bits in a D/A converted this equals 30/6=5 bit resolution where 6 dB [20 log(2)] accounts for every additional bit.

Assume that we have a signal that is a 4-tone continuous wave (CW) signal as described by Equation (1) below. This signal shall be fed through a non-linear device such as for example an MCPA with the non-linear characteristics as described by Equation 3. This equation describes a polynomial approximation to the non-linear function and can also be extended to include the phase variation as a function of amplitude. In order to counter-act the non-linear behavior of this device a pre-distorter is designed to minimize the distortion or inter-modulation products in the output of the device. This pre-distorter is found to be as described in Equation (3) below. Derivation of this particular function and its coefficients is not considered crucial for understanding of the technology but provides a good example.

Signal:

$$a(t) := \sin(2 \cdot \pi f1 \cdot t) + \sin(2 \cdot \pi \cdot f2 \cdot t) + \sin(2 \cdot \pi \cdot f3 \cdot t) + \sin(2 \cdot \pi f4 \cdot t) \quad (1)$$

Distorted signal:

$$\alpha := 0.005$$

$$g(t) := a(t) \cdot 1 + \alpha \cdot a(t)^3 \quad (2)$$

Pre-distortion signal sent through a MPCA $$\beta := -0.00005$$

$$MPCA(t) = g(t) - \alpha \cdot g(t)^3 - \beta \cdot g(t)^5 \quad (3)$$

Figure 9A:
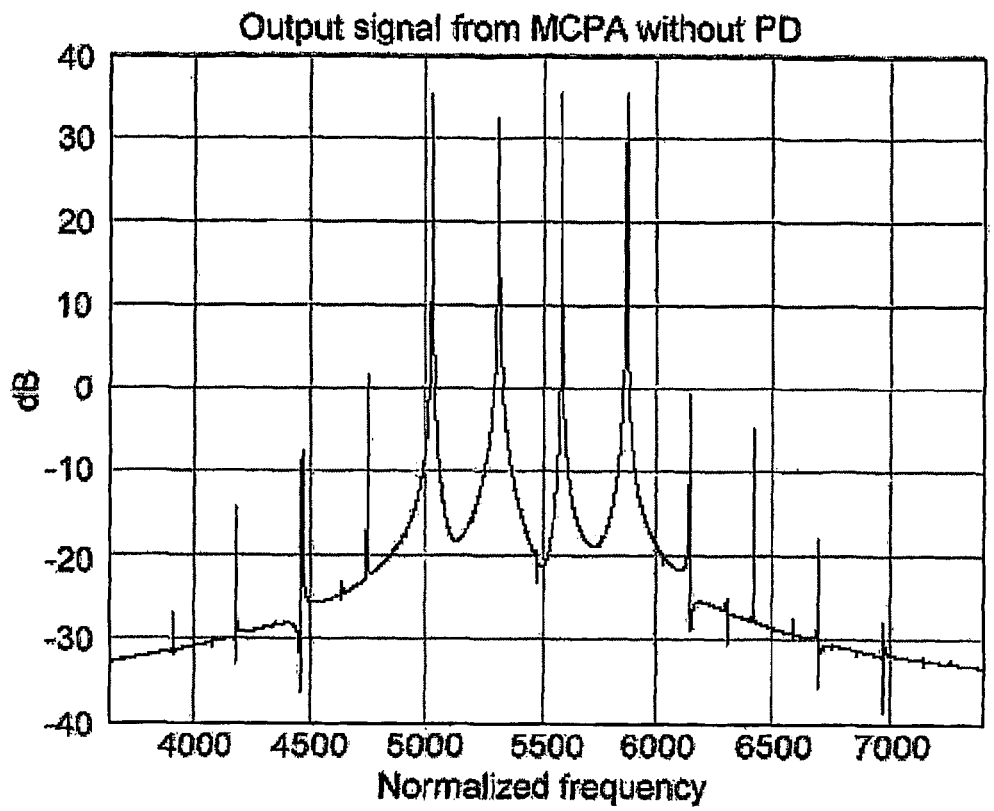
FIG. 9a shows output spectrum from the MCPA without pre-distortion for an example when a 4-tone carrier ensemble is fed through a nonlinear device.
Figure 9B:
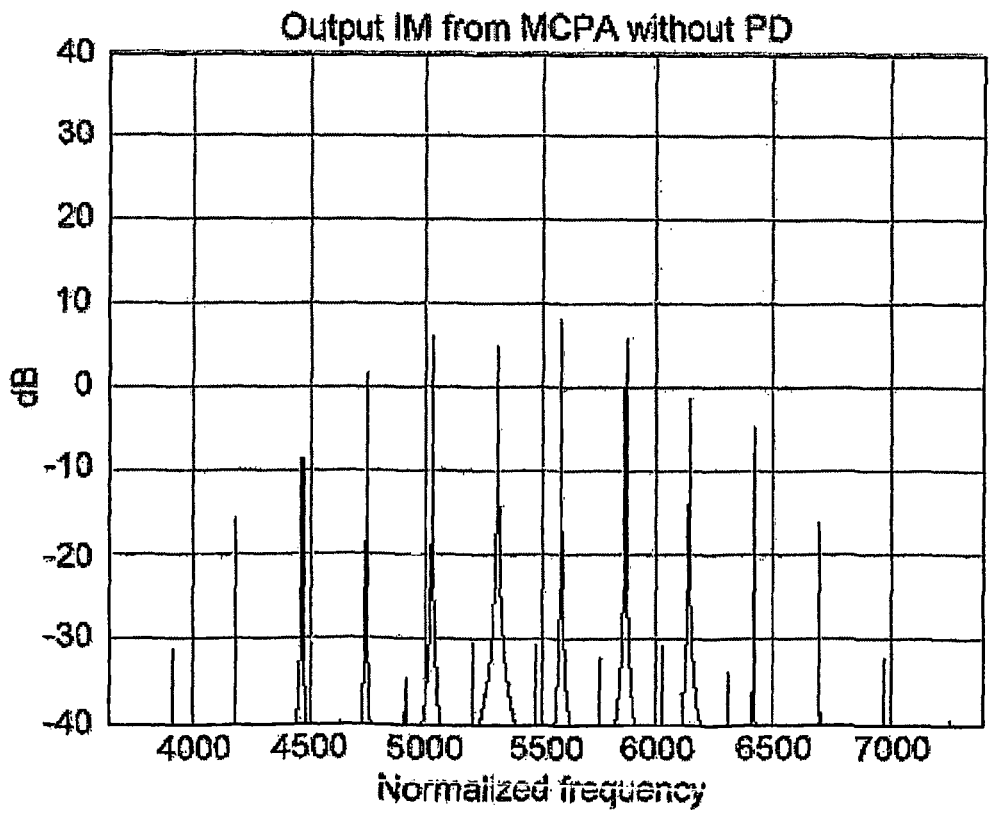
FIG. 9b shows output spectrum for MCPA when the carriers themselves have been suppressed to highlight the distortion itself.

If the signal in Equation (1) is fed into the non-linear device as exemplified by the MCPA characteristics in Equation (3), we will get a distorted signal spectrum which is depicted in FIG. 9a and FIG. 9b. It should be noted that we have not yet applied the pre-distortion. So we see that for this particular choice of non-linear function we have a distortion level (or inter-modulation level if you like) that is in this case only some 30 dB's below the carrier level.

Figure 12A:
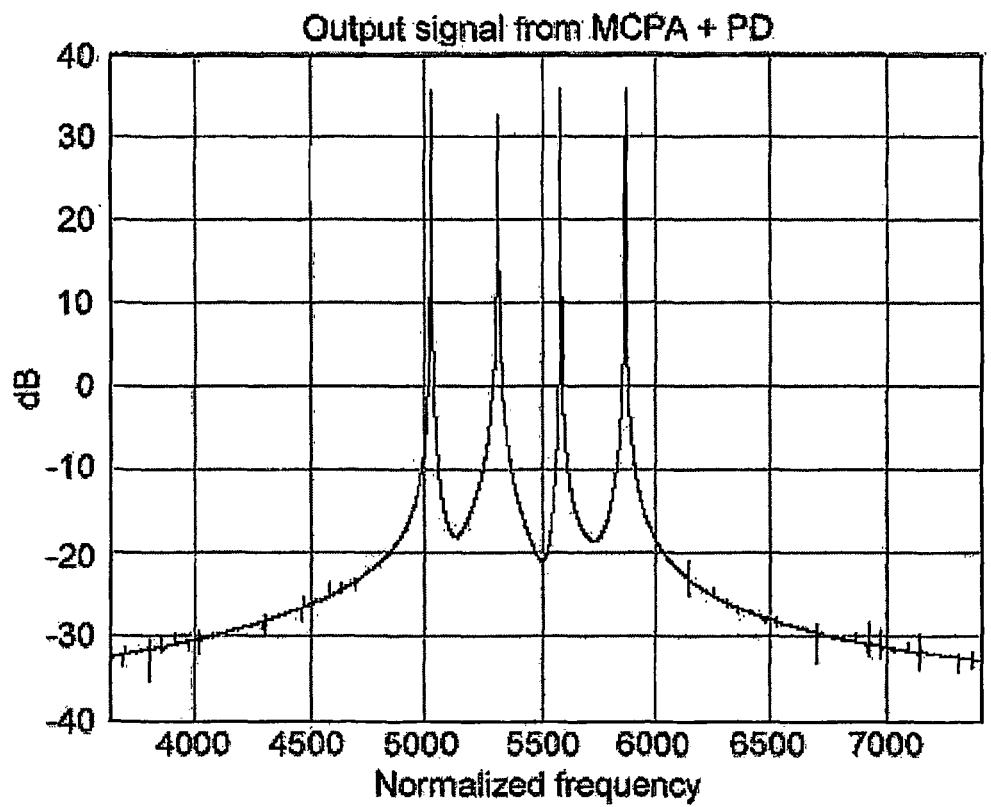
FIG. 12a shows a signal spectrum of four equal CW carriers at regular frequency intervals fed through a nonlinear pre-distortion device characterized by Equation (2) and fed to the non-linear MCPA as described by Equation (3), whereby the pre-distortion part has been computed at a resolution of 7 bits.
Figure 12B:
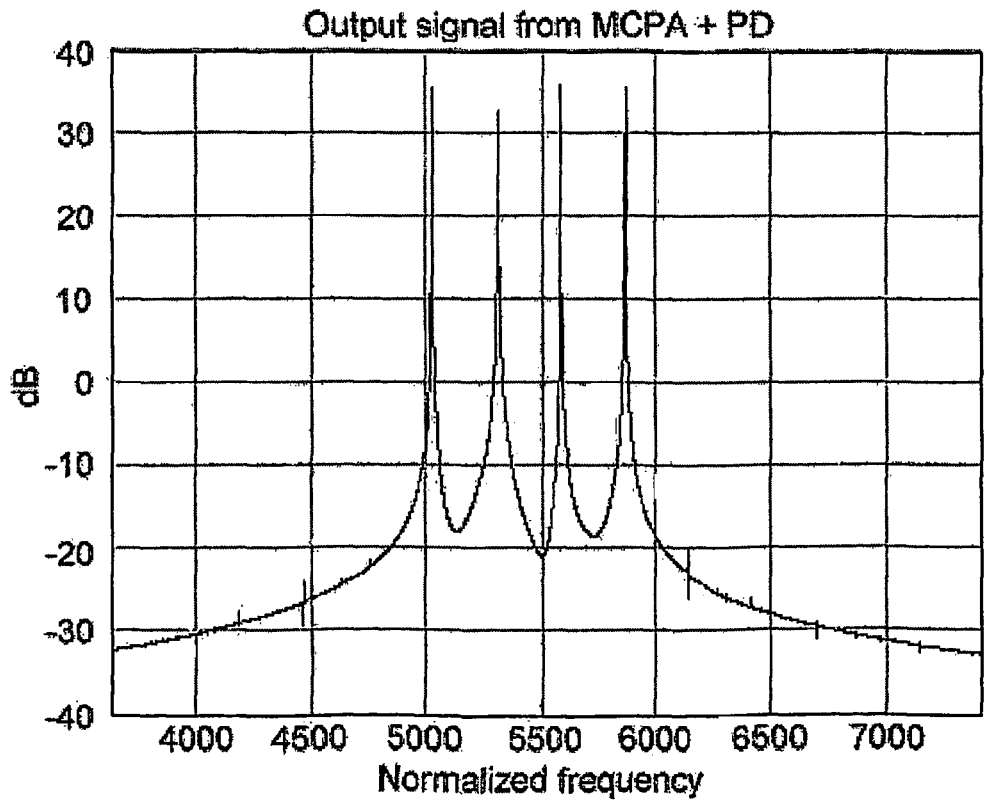
Figure 13A:
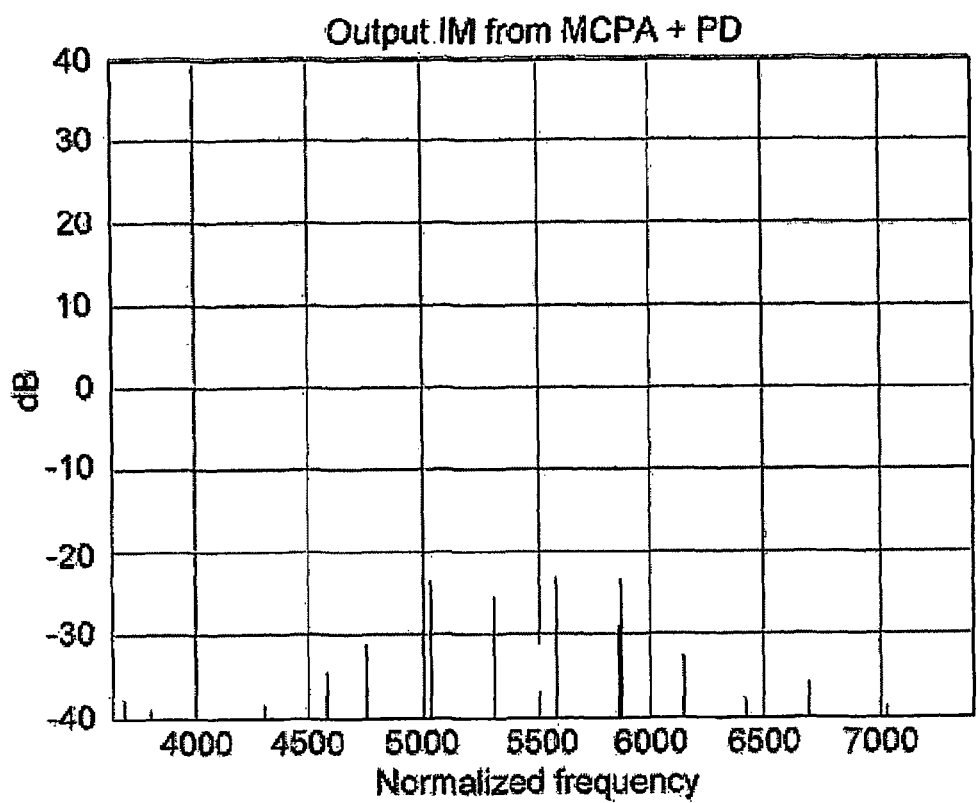
FIG. 13a shows the same spectrum as in FIG. 12a except for the carrier parts, which have been subtracted to highlight the distorted spectrum.
Figure 13B:
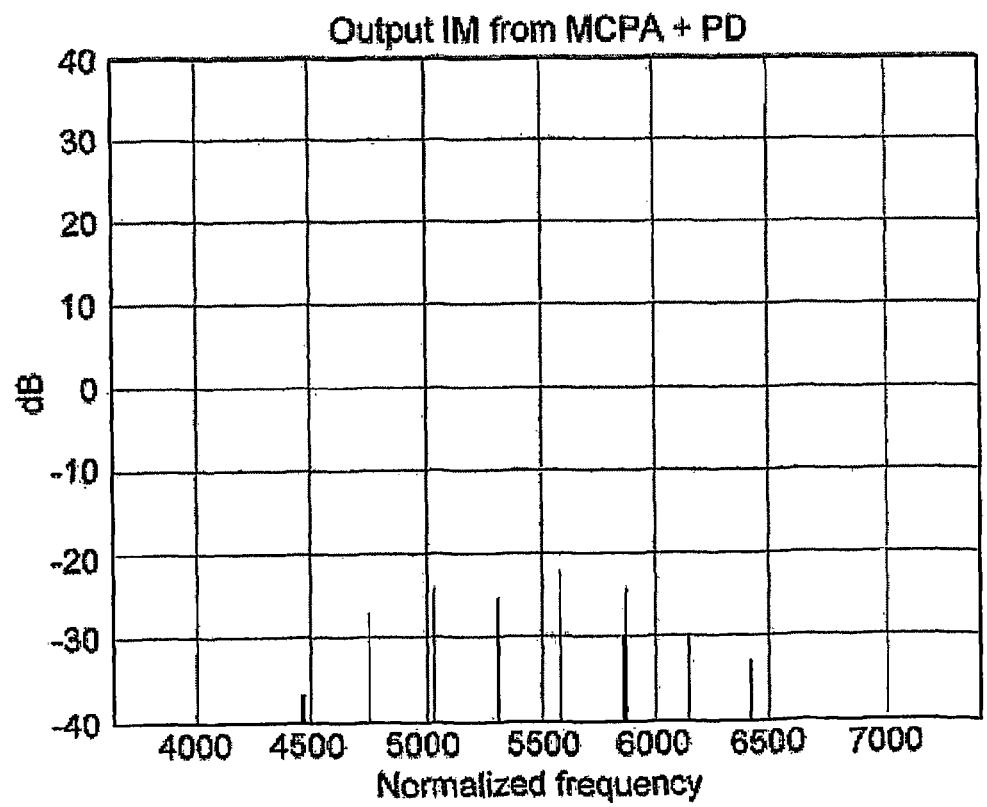
FIG. 13b shows the same spectrum as in FIG. 12b except for the carrier parts, which have been subtracted to highlight the distorted spectrum.

FIG. 12a and FIG. 12b shows the output spectrum of the combined pre-distorter and non-linear device (e.g. MCPA). The two graphs show the comparison between using full resolution (number of bits) to using only for example 7 bits for the B-branch, which is the by-passed part. As can be seen there is almost no visible difference between the two curves. By extracting the carrier part it is even more evident by view of FIG. 13a and FIG. 13b. The two graphs show the same signal spectrums as in the previous graph, only the carriers have been taken out and only the distortion is left. It is seen that the inter-modulation for this particular choice of coefficients has been improved by around 30 dB.

Figure 10A:
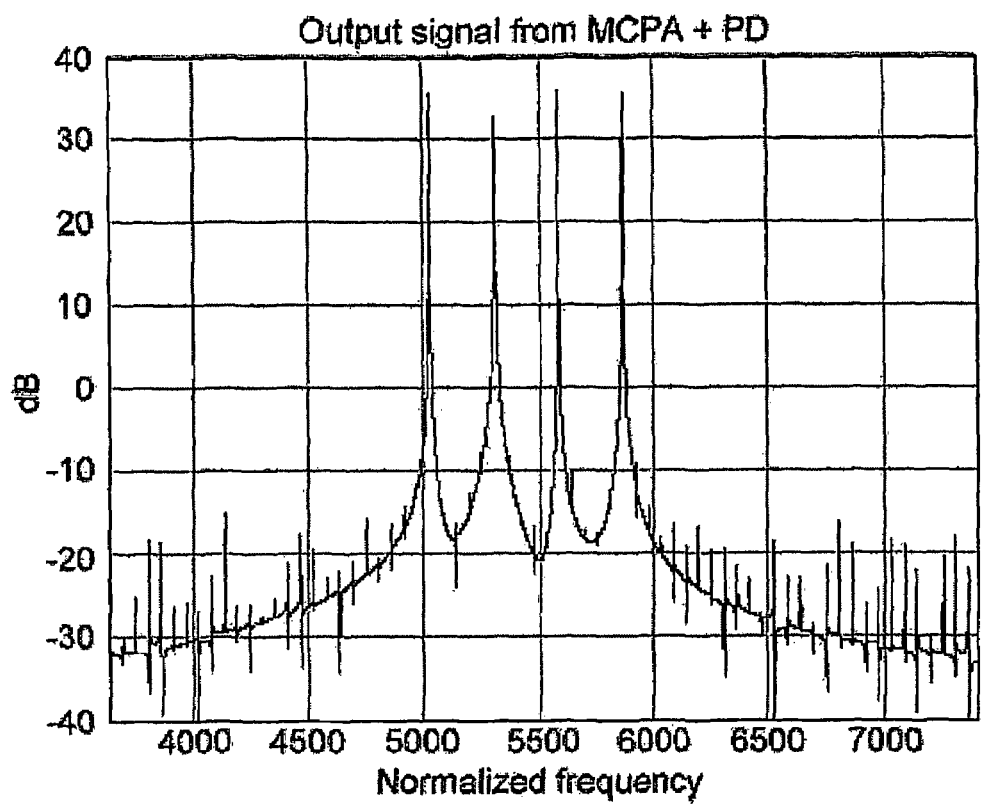
FIG. 10a shows a signal spectrum of four equal CW carriers at regular frequency intervals fed through a nonlinear pre-distortion device characterized by Equation (2) and fed to the non-linear MCPA as described by Equation (3), whereby the pre-distortion part has been computed at a resolution of 3 bits and carriers part at resolution of 15 bits.
Figure 10B:
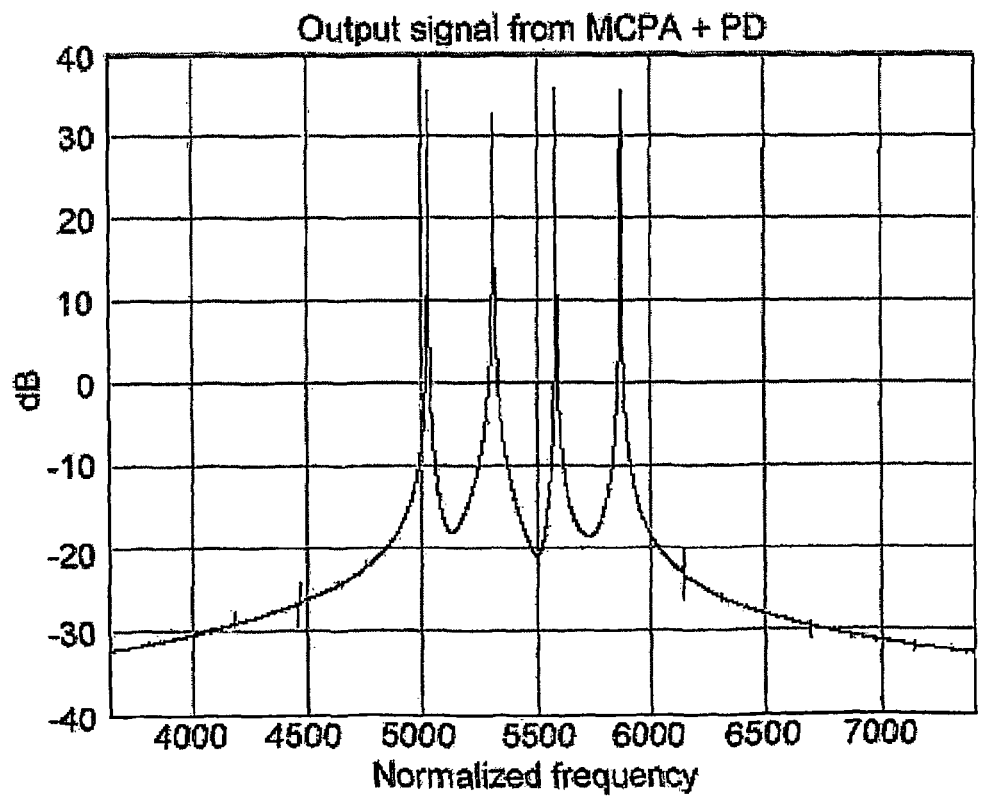
FIG. 10b shows a corresponding diagram as FIG. 10a except that a full resolution of 15 bits is used for both signal parts.
Figure 11A:
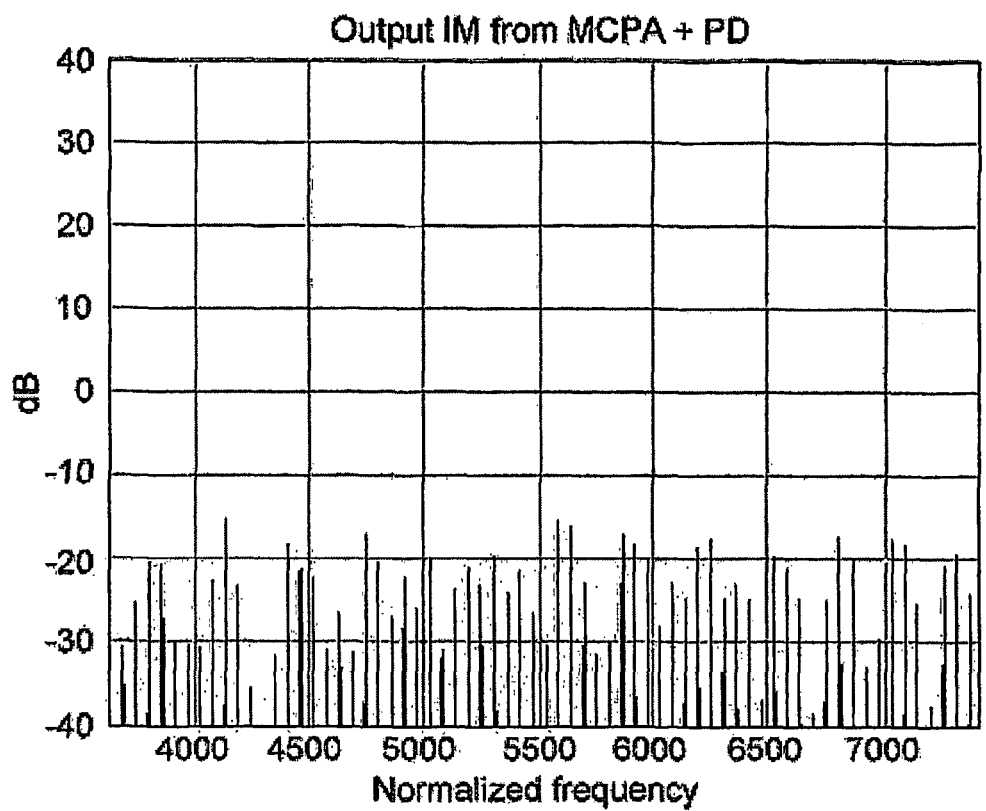
FIG. 11a shows the same spectrum as in FIG. 10a where the carriers have been subtracted to highlight the distorted spectrum part.
Figure 11B:
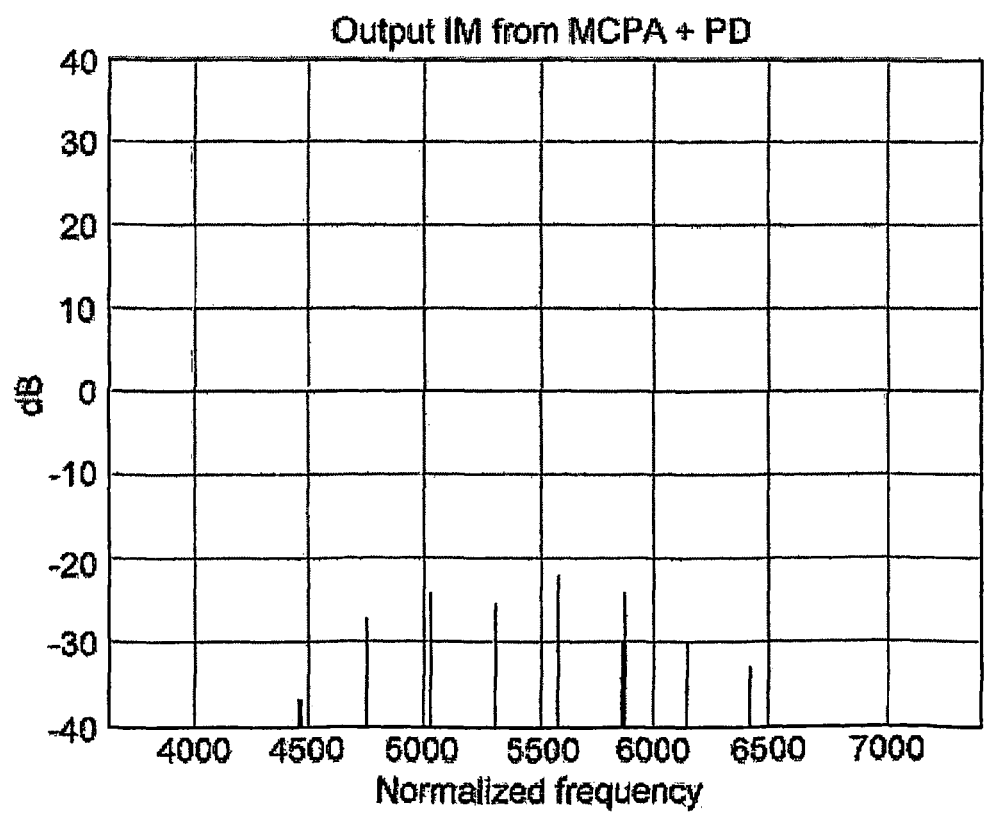
FIG. 11b shows the same spectrum as in FIG. 10b where the carriers have been subtracted to highlight the distorted spectrum part.

As a further example, we may reduce the number of bits in the resolution to only 3 bits (including the sign bit). The result is shown in FIG. 10a and FIG. 12b together with the same output if we would have full resolution of 15 bits in both A- and B-branches. Now there is a more noticeable difference but still, in view of FIG. 11a and FIG. 11b where the carriers have been removed, the level of distortion/inter-modulation is reduced by 30 dB. The only difference in this case is that a broad band of spurious signals can be seen that was not there in the previous example with 7 bit resolution.

The simulated results described herein show that use of two separate D/A converters for the A- and B-branches gives very good results in terms of intermodulation levels.

Thus, the technology described herein encompasses a method, by means of digital pre-distortion, of linearizing an output signal from an inherently non-linear device producing intermodulation or non-linear products in its output signal. In an example embodiment, the method comprises the acts of:

sampling an original signal with a high number of bits at a given sampling rate for a desired signal resolution of an achieved digital original signal message; and re-sampling the original signal at a lower number of bits with a several times higher sampling rate for creating a digital pre-distortion signal to be added to the achieved digital original signal message, thereby forming a digital pre-distorted signal to be fed to the inherently non-linear device after digital to analog conversion.

In further aspects, the method can comprise the acts of:

using, for a first high resolution digital signal, a sampling frequency corresponding to at least twice the highest frequency of a desired original signal message bandwidth in accordance to the Nyquist theorem;

using, for a second digital signal, a high sampling rate corresponding to a frequency of at least a desired B-branch error message bandwidth, and whereby a resolution in bits of the original digital message is defined by a desired dynamic range below a carrier in decibels level being $A_{DB}$, and the resolution in number of bits of the pre-distorted digital signal to be added is defined as at least $(A_{DB}-B_{DB})/6$, wherein $B_{DB}$ is level of harmonics below the carrier in decibels to be cancelled.

In further aspects, the method can comprise the acts of:

selecting for the first high resolutions digital signal A/D conversion of 16 bits, and selecting for the second low resolution digital signal A/D conversion of 8 bits with, e.g., three times the sampling frequency of the first high resolution digital signal.

In further aspects, the method can comprise the acts of:

selecting for the first high resolutions digital signal A/D conversion of 16 bits, and selecting for the second low resolution digital signal A/D conversion of 6 bits at an even higher sampling e.g. with five times the sampling frequency of the first high resolution digital signal.

Advantageously, no change in sampling rate needs to be implemented in the original signal in order to provide a wideband pre-distorted signal. A wide-band signal for the pre-distortion part is required to pre-distort a signal on the input of a non-linear device such as for example an MCPA. However, since this broadband signal is added after D/A conversion in the analog signal domain, there is no restriction on the sampling rate of the original signal. Only the by-passed distortion part of the signal has to be implemented with a high sampling rate. A real benefit from this proposal is that this by-pass D/A converter need not be a high resolution D/A, but can be any ordinary low cost D/A but with high sampling rate. Thus, digital pre-distortion can be implemented using existing D/A converters without loss of performance when connected to the non-linear device such as the MCPA.

Linearizing an output signal from an inherently non-linear device producing intermodulation products in its output signal as a response to an input signal, in accordance with the present invention, may be embodied in a numerous number of ways without departure from the scope and spirit of the present invention, which is defined by the attached claims.

The invention claimed is:

1. A method, by means of digital pre-distortion, of linearizing an output signal from an inherently non-linear device producing intermodulation or non-linear products in its output signal, the method comprising:

sampling an original signal with a first sampling rate for a desired signal resolution of an achieved digital original signal message;

re-sampling the original signal at a second sampling rate for creating a digital pre-distortion signal, the second sampling rate being greater than the first sampling rate;

performing a digital to analog conversion of the digital sample original signal to obtain an analog-converted original signal and performing a digital to analog conversion of the digital pre-distortion signal to obtain an analog-converted pre-distortion signal;

adding the analog-converted original signal and the analog-converted pre-distortion signal, thereby forming a pre-distorted signal to be fed to the inherently non-linear device.

2. The method according to claim 1, further comprising:

using for a first high resolution digital signal a sampling frequency corresponding to at least twice the highest frequency of a desired original signal message bandwidth in accordance to the Nyquist theorem;

using for a second digital signal a high sampling rate corresponding to a frequency of at least a desired error message bandwidth, whereby a resolution in bits of the original digital message is defined by a desired dynamic range below a carrier in decibels level being $A_{DB}$, and the resolution in number of bits of the pre-distortion digital signal to be added is defined as at least $(A_{DB}-B_{DB})/6$, wherein $B_{DB}$ is the level of harmonics below the carrier in decibels to be cancelled.

3. The method according to claim 2, further comprising:

selecting, for the first high resolution digital signal, resolution of 16 bits, and selecting, for the second digital signal, a resolution of 8 bits at three times the sampling frequency of the first high resolution digital signal.

4. The method according to claim 2, further comprising:

selecting, for the first high resolution digital signal, a resolution of 16 bits, and selecting, for the second digital signal, a resolution of 6 bits five times the sampling frequency of the first high resolution digital signal.

5. A digital pre-distorter configured to receive an output signal from an inherently non-linear device, the non-linear device producing intermodulation or non-linear products in its device output signal, the circuitry comprising:

a first branch comprising a first digital to analog converter and configured to receive the device output signal, the first digital to analog converter being configured to sample the device output signal at a first sampling rate and at a first resolution and to provide first analog signal;

a second branch comprising a second digital to analog converter configured to receive a predistortion signal based on a resampling of the device output signal, the second analog to digital converter being configured to sample the pre-distortion signal at a second sampling rate and at a second resolution and to provide a second analog signal;

wherein the second sampling rate is higher than the first sampling rate;

wherein the second resolution is lower than the first resolution; and a combiner configured to combine, in an analog domain, the first analog signal and the second analog signal for forming a pre-distorted signal.

6. The apparatus of claim 5, wherein the first resolution is sixteen bits and the second resolution is 8 bits.

7. The apparatus of claim 6, wherein the first second sampling rate is three times the first sampling rate.

8. The apparatus of claim 5, wherein the first resolution is sixteen bits and the second resolution is six bits.

9. The apparatus of claim 8, wherein the first second sampling rate is five times the first sampling rate.

10. The apparatus of claim 5, wherein a resolution in bits of the device output signal is defined by a desired dynamic range below a carrier in decibels level being $A_{DB}$, and the resolution in number of bits of the pre-distortion signal to be added is defined as at least $(A_{DB}-B_{DB})/6$, wherein $B_{DB}$ is the level of harmonics below the carrier in decibels to be cancelled.

11. A method of performing digital pre-distortion of an output signal received from an inherently non-linear device, the non-linear device producing intermodulation or non-linear products in its device output signal, the method comprising:

using a first digital to analog converter to sample the device output signal at a first sampling rate and at a first resolution and to provide a first analog signal;

using a second analog to digital converter to sample a pre-distortion signal at a second sampling rate and at a second resolution and to provide a second analog signal;

wherein the second sampling rate is higher than the first sampling rate;

wherein the second resolution is lower than the first resolution; and combining, in an analog domain, the first analog signal and the second analog signal.

12. The method of claim 11, wherein the first resolution is sixteen bits and the second resolution is 8 bits.

13. The method of claim 12, wherein the first second sampling rate is three times higher than the first sampling rate.

14. The method of claim 11, wherein the first resolution is sixteen bits and the second resolution is six bits.

15. The method of claim 14, wherein the first second sampling rate is five times the first sampling rate.

16. The method of claim 11, wherein a resolution in bits of the device output signal is defined by a desired dynamic range below a carrier in decibels level being $A_{DB}$, and the resolution in number of bits of the pre-distortion signal to be added is defined as at least $(A_{DB}-B_{DB})/6$, wherein $B_{DB}$ is the level of harmonics below the carrier in decibels to be cancelled.

17. The method of claim 11, further comprising providing alignment of the first analog signal and the second analog signal prior to combining the first analog signal and the second analog signal.

* * * * *

UNITED STATES PATENT AND TRADEMARK OFFICE
CERTIFICATE OF CORRECTION

| | | |
|---|---|---|
| PATENT NO. | : 7,505,530 B2 | Page 1 of 1 |
| APPLICATION NO. | : 10/480835 | |
| DATED | : March 17, 2009 | |
| INVENTOR(S) | : L. Rexberg et al. | |

It is certified that error appears in the above-identified patent and that said Letters Patent is hereby corrected as shown below:

On the Title Page, please correct the PCT Filed Item (22) to read as follows:

(22) PCT Filed: June 5, 2002

Signed and Sealed this
Sixth Day of January, 2015

Michelle K. Lee
*Deputy Director of the United States Patent and Trademark Office*